(12) United States Patent
Sud et al.

(10) Patent No.: US 11,634,891 B2
(45) Date of Patent: Apr. 25, 2023

(54) SYSTEM AND METHOD FOR NAVIGATING AN OPERATOR TO COUPLE A SELF-PROPELLED VEHICLE WITH AN ATTACHMENT IMPLEMENT THEREFOR

(71) Applicant: Deere & Company, Moline, IL (US)

(72) Inventors: Aashish Sud, Panchkula (IN); Salimnawaz Shaikh, Thane (IN); Amit Naik, Corlim (IN)

(73) Assignee: Deere & Company, Moline, IL (US)

( * ) Notice: Subject to any disclaimer, the term of this patent is extended or adjusted under 35 U.S.C. 154(b) by 227 days.

(21) Appl. No.: 17/120,957

(22) Filed: Dec. 14, 2020

(65) Prior Publication Data
US 2022/0112696 A1    Apr. 14, 2022

(30) Foreign Application Priority Data
Oct. 8, 2020 (IN) .......................... 20 2021 043 858

(51) Int. Cl.
*E02F 9/26* (2006.01)
*B60K 35/00* (2006.01)
(Continued)

(52) U.S. Cl.
CPC .............. *E02F 9/264* (2013.01); *B60K 35/00* (2013.01); *A01B 59/00* (2013.01); *A01B 59/04* (2013.01);
(Continued)

(58) Field of Classification Search
CPC ......... E02F 9/264; E02F 9/205; E02F 3/3609; E02F 3/96; E02F 3/3604; E02F 9/26;
(Continued)

(56) References Cited

U.S. PATENT DOCUMENTS

| | | |
|---|---|---|
| 5,108,123 A | 4/1992 | Rubenzik |
| 5,191,328 A * | 3/1993 | Nelson ..................... G01S 11/16 702/159 |

(Continued)

OTHER PUBLICATIONS

German Search Report issued in application No. DE102021209196.2 dated May 17, 2022 (10 pages).

*Primary Examiner* — Douglas M Wilson
(74) *Attorney, Agent, or Firm* — Gary L. Montle; Lucian Wayne Beavers; Patterson Intellectual Property Law, PC (57) ABSTRACT

Systems and methods are disclosed herein for navigating an operator of a self-propelled vehicle for coupling with an attachment implement therefor. Each one of a first set of sensing elements arranged on the vehicle coupler forms a sensing pair with a respective one of a set of second sensing elements arranged on the attachment implement. Indicia for each of the sensing pairs on a user interface is displayed to the operator, corresponding to a three-dimensional spatial orientation of the first and second sensing elements with respect to each other. The user interface may comprise respective portions for each sensing pair, each portion comprising an indicator dynamically adjusted in a crosshair corresponding to first and second dimensions of alignment of the corresponding sensing elements with respect to each other, and the indicator in each portion further dynamically adjusted in appearance corresponding to a third dimension of distance between the corresponding sensing elements.

13 Claims, 5 Drawing Sheets

(51) Int. Cl.
*B60D 1/36* (2006.01)
*G01B 7/00* (2006.01)
*G01R 33/07* (2006.01)
*G01D 5/14* (2006.01)
*G01R 33/02* (2006.01)
*E02F 9/20* (2006.01)
*E02F 3/36* (2006.01)
*E02F 3/96* (2006.01)
*A01B 59/04* (2006.01)
*A01B 59/06* (2006.01)
*A01B 59/00* (2006.01)

(52) U.S. Cl.
CPC ............ *A01B 59/06* (2013.01); *A01B 59/065* (2013.01); *B60D 1/36* (2013.01); *B60K 2370/1531* (2019.05); *B60K 2370/188* (2019.05); *B60K 2370/61* (2019.05); *E02F 3/3604* (2013.01); *E02F 3/3609* (2013.01); *E02F 3/96* (2013.01); *E02F 9/205* (2013.01); *G01B 7/003* (2013.01); *G01D 5/145* (2013.01); *G01R 33/02* (2013.01); *G01R 33/07* (2013.01)

(58) Field of Classification Search
CPC ........ E02F 9/2037; E02F 3/842; B60K 35/00; B60K 2370/1531; B60K 2370/188; B60K 2370/61; B60K 2370/152; B60K 2370/179; B60K 2370/193; B60D 1/36; G01B 7/003; G01R 33/07; G01R 33/02; B60W 50/14; B60W 2300/17; B62D 15/029; B62D 49/0614; G05D 1/0259; G09G 2380/10; B60Y 2200/41; G01D 5/145

See application file for complete search history.

(56) References Cited

U.S. PATENT DOCUMENTS

| | | | |
|---|---|---|---|
| 5,650,764 A * | 7/1997 | McCullough | B60D 1/36 250/206.1 |
| 5,861,814 A | 1/1999 | Clayton | |
| 6,222,457 B1 | 4/2001 | Mills et al. | |
| 6,259,357 B1 | 7/2001 | Heider | |
| 6,480,104 B1 | 11/2002 | Wall et al. | |
| 6,581,695 B2 * | 6/2003 | Bernhardt | A01B 59/068 37/234 |
| 6,769,709 B1 | 8/2004 | Piper et al. | |
| 9,649,899 B1 | 5/2017 | Berry et al. | |
| 10,351,061 B1 * | 7/2019 | Chaudhari | B60R 1/003 |
| 2002/0125018 A1 * | 9/2002 | Bernhardt | B60D 1/36 172/439 |
| 2007/0132560 A1 | 6/2007 | Nystrom et al. | |
| 2015/0025761 A1 * | 1/2015 | Kernebeck | G01B 7/003 324/207.11 |
| 2016/0076219 A1 | 3/2016 | Martinez et al. | |
| 2016/0183841 A1 * | 6/2016 | Duindam | A61B 5/743 600/424 |
| 2016/0312432 A1 | 10/2016 | Wang et al. | |
| 2017/0089029 A1 | 3/2017 | Esqueda | |
| 2018/0238016 A1 * | 8/2018 | Seacat | E02F 3/7613 |
| 2020/0025843 A1 * | 1/2020 | Crescentini | G01R 33/0005 |
| 2020/0114711 A1 | 4/2020 | Nixon | |
| 2020/0400462 A1 * | 12/2020 | Hammerschmidt | G01D 5/145 |

* cited by examiner

SYSTEM AND METHOD FOR NAVIGATING AN OPERATOR TO COUPLE A SELF-PROPELLED VEHICLE WITH AN ATTACHMENT IMPLEMENT THEREFOR

FIELD OF THE DISCLOSURE

The present disclosure relates generally to self-propelled work vehicles configured for coupling with attachment implements, and more particularly to systems and methods for assisting operators in said coupling.

BACKGROUND

Self-propelled work vehicles as discussed herein may for example include excavator machines, loaders, and other equipment which modify the terrain or equivalent working environment in some way. More particularly, such vehicles according to the present disclosure are equipped with a coupling device configured to couple the work vehicle to an attachment implement for modifying the terrain or equivalent working environment, or at least assisting the work vehicle therefor.

With an increasing variety of attachments available for the different types of work vehicles, it becomes increasingly desirable to provide systems and methods for quick and straightforward coupling of given attachments with associated boom/vehicles, with minimum effort.

A first exemplary coupling mechanism as known in the art involves a mechanical alignment between work vehicles such as loaders and their corresponding attachments. A first set of hooks, which may for example be provided on the attachment implement, are configured to physically engage respective elements on the work vehicle, which accordingly guide a pin to its desired alignment. The pin can then be manually set to lock the attachment implement in place relative to the work vehicle, or alternatively a hydraulic pin may be selectively triggered from the operator cab to accomplish the same.

A second exemplary coupling mechanism as known in the art involves alignment between an attachment and a boom that moves relative to the main frame of a vehicle such as for example an excavator or skid steer loader. In these cases, the selectively moving boom and the corresponding attachment are typically aligned visually by a skilled operator from the vehicle cab.

Each of the aforementioned conventional systems relies heavily on operator intuition, which naturally depends on how well the operator is trained. Manual aligning of the attachment with the boom can also be problematic, as for example the attachment could be on uneven ground or on a slope. Also, when the vehicle is in close proximity to the attachment, visibility of the attachment pin may typically be quite poor from the perspective of the operator cab. The direction in which the operator approaches the attachment can also frequently be misaligned, as both the vehicle and the attachment should be parallel to each other. In these scenarios a second person is required on ground to help navigate the vehicle operator and align the same with the attachment.

Therefore, it would be desirable to provide a system capable of better assisting operators in navigating the work vehicle and/or boom precisely to given attachments, in various work environments and at close proximity.

BRIEF SUMMARY

The current disclosure provides an enhancement to conventional systems, at least in part by introducing a novel system and method for describing a position/offset of a properly equipped attachment with respect to a coupler located on a boom/work vehicle in three-dimensional (3D) space on an operator-accessible display unit.

Various embodiments of such enhancements as disclosed herein may desirably be used in low visibility and/or when the self-propelled vehicle is in close proximity with the desired attachment implement. Accordingly, the systems and methods disclosed herein may facilitate ease and efficiency of operation for the vehicle operator, particularly newer and less-skilled operators, without the need of a second ground operator to navigate the self-propelled work vehicle and/or associated boom assembly towards the attachment implement.

In one embodiment, a system and method is disclosed herein for navigating an operator of a self-propelled vehicle for coupling with an attachment implement therefor. A plurality of first sensing elements is arranged with respect to a coupler associated with the self-propelled vehicle, each one of the plurality of first sensing elements forming a sensing pair with a respective one of a plurality of second sensing elements arranged with respect to the attachment implement. Indicia is displayed for each of the plurality of sensing pairs on a user interface in functional communication with at least the plurality of first sensing elements, the indicia for a respective sensing pair corresponding to a three-dimensional spatial orientation of the first and second sensing elements with respect to each other.

In one exemplary aspect of the above-referenced embodiment, the user interface may comprise a respective portion for each of the plurality of sensing pairs, with each portion comprising an indicator dynamically adjusted in position corresponding to first and second dimensions of alignment of the corresponding first and second sensing elements with respect to each other. The indicator in each portion may be further dynamically adjusted in appearance corresponding to a third dimension of distance between the corresponding first and second sensing elements.

In another exemplary aspect of the above-referenced embodiment, each of the plurality of portions may comprise a crosshair representing the first and second dimensions.

In another exemplary aspect of the above-referenced embodiment, the indicator in each portion may be color-coded corresponding to the distance between the corresponding first and second sensing elements.

In another exemplary aspect of the above-referenced embodiment, the second sensing elements may comprise magnets mounted in a defined orientation on the attachment implement, and the first sensing elements may comprise a like number of sensor modules mounted in a corresponding defined orientation with respect to the coupler on the work vehicle.

In another exemplary aspect of the above-referenced embodiment, each of the sensor modules may comprise a plurality of Hall-effect sensors mounted about the circumference of a disc-shaped module.

In another exemplary aspect of the above-referenced embodiment, each of the sensing modules may comprise a controller configured to receive signals corresponding to a respective magnetic field strength from each of the sensors mounted therein, determine relative positions of each sensor with respect to the corresponding magnet, and generate output signals to the user interface via a communications network, the output signals corresponding to the three-dimensional spatial orientation of the sensing module with respect to the magnet.

In another exemplary aspect of the above-referenced embodiment, the self-propelled vehicle may comprise a main frame and a boom having a distal end moveable with respect to the main frame, wherein the plurality of first sensing elements and the coupler are arranged at the distal end of the boom.

Numerous objects, features and advantages of the embodiments set forth herein will be readily apparent to those skilled in the art upon reading of the following disclosure when taken in conjunction with the accompanying drawings.

DETAILED DESCRIPTION

Referring now to FIGS. 1-7B, various embodiments may now be described of a system and method for navigating operators of a self-propelled work vehicle with respect to attachment implements therefor.

Figure 1:
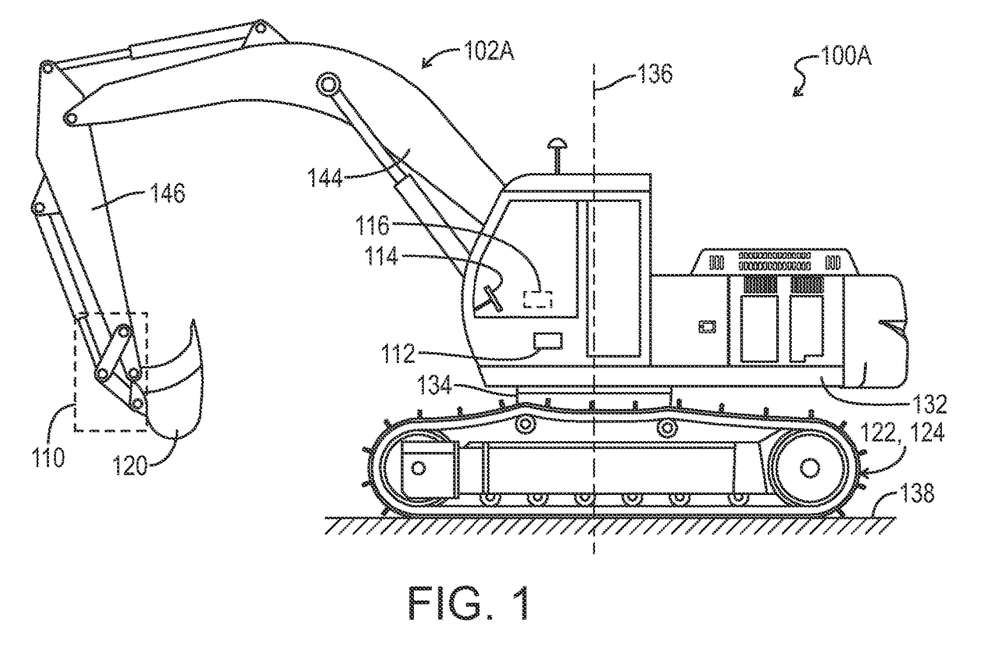
FIG. 1 is a side view of a tracked excavator as an exemplary self-propelled work vehicle having an attachment implement according to an embodiment as disclosed herein.
Figure 2:
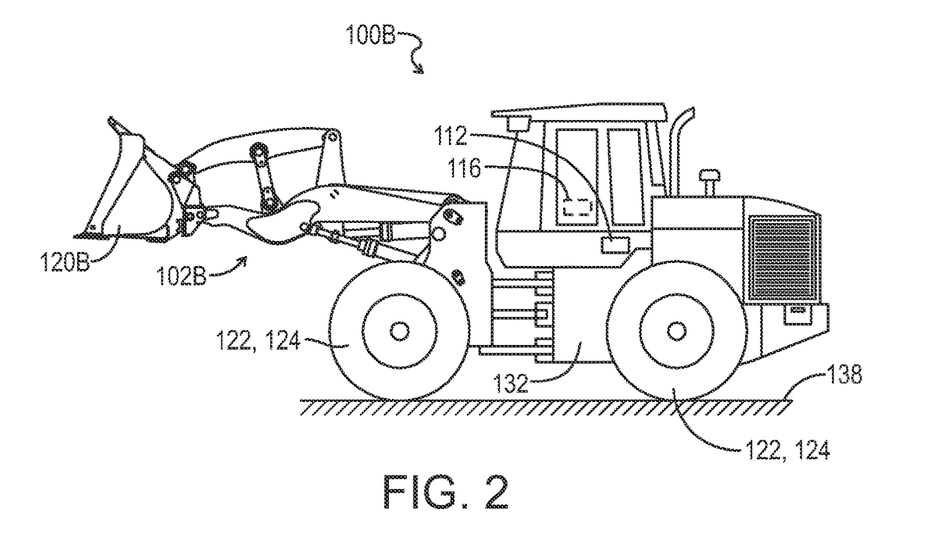
FIG. 2 is a side view of a loader as another exemplary self-propelled work vehicle having an attachment implement according to an embodiment as disclosed herein.

FIG. 1 in a particular embodiment as disclosed herein shows a representative work vehicle in the context of a tracked excavator machine 100A having a front-mounted working implement 120A for modifying the proximate terrain. In certain embodiments, however, systems and methods as disclosed herein may also be applicable to vehicles lacking explicit work implements. A work vehicle 100 as disclosed herein may also be in the form of a loader 100B as shown in FIG. 2. It is within the scope of the present disclosure that the work vehicle 100 may be in the form of any other self-propelled vehicle using an attachment implement to modify the proximate terrain, particularly a work vehicle designed for use in off-highway environments such as a construction or forestry vehicle, for example.

Except as otherwise noted herein, reference numbers used to refer to components of self-propelled work vehicle 100A are correspondingly used in reference to wheel drive vehicle 100B, except with "B" replacing the "A" identifier. In addition, self-propelled work vehicles 100A and 100B and their associated structures may be referred to generically as their numeric identifier only, e.g., "100" may be used herein to refer to either of self-propelled work vehicles 100A, 100B.

The illustrated and exemplary tracked excavator machine 100A includes an undercarriage including a left-side tracked ground engaging unit 122 and a right-side tracked ground engaging unit 124, and at least one travel motor (not shown) for driving the respective ground engaging units. Each of the tracked ground engaging units 122, 124 may typically include a front idler, a drive sprocket, and a track chain extending around the front idler and the drive sprocket. The travel motor of each tracked ground engaging unit 122, 124 drives its respective drive sprocket. Each tracked ground engaging unit 122, 124 has a forward traveling direction defined from the drive sprocket toward the front idler. The forward traveling direction of the tracked ground engaging units 122, 124 also defines a forward traveling direction of the undercarriage and thus of the working machine 100.

A main frame 132 is supported by the undercarriage via a swing bearing 134 such that the main frame 132 is pivotable about a pivot axis 136 relative to the undercarriage. The pivot axis 136 is substantially vertical when a ground surface 138 engaged by the ground engaging units 122, 124 is substantially horizontal. A swing motor (not shown) is configured to pivot the main frame 132 on the swing bearing 134 about the pivot axis 136 relative to the undercarriage.

A self-propelled work vehicle such as the tracked excavator machine 100A as shown in FIG. 1 typically includes a boom assembly 102A defined for example by a boom 144, an arm 146 pivotally connected to the boom 144. The boom 144 in the present example is pivotally attached to the main frame 132 to pivot about a generally horizontal axis relative to the main frame 132. A coupling mechanism 110, or coupler 110, is provided at the end of the arm 146 and configured for coupling to an attachment implement 120. The attachment implement may also be characterized as a working tool, and in various embodiments the coupler 110 may be configured for engaging and securing various types and/or sizes of attachment implements. The working tool in this embodiment is an excavator shovel or bucket 120 which is pivotally connected to the arm 146 via the coupler 110. The boom assembly 102A extends from the main frame 132 along a working direction of the boom assembly. The working direction can also be described as a working direction of the boom 144.

An operator's cab may be located on the main frame 132. The operator's cab and the one or more working implements 102A may both be mounted on the main frame so that the operator's cab faces in the working direction of the working implements. A control station including a user interface 116 may be located in the operator's cab.

The term "user interface" 116 as used herein may broadly take the form of a display unit and/or other outputs from the system such as indicator lights, audible alerts, and the like. The user interface may further or alternatively include various controls or user inputs (e.g., a steering wheel, joysticks, levers, buttons) 114 for operating the work vehicle 100, including operation of the engine, hydraulic cylinders, and the like. Such an onboard user interface may be coupled to a vehicle control system via for example a CAN bus arrangement or other equivalent forms of electrical and/or electro-mechanical signal transmission. Another form of user interface (not shown) may take the form of a display that is generated on a remote (i.e., not onboard) computing device, which may display outputs such as status indications and/or otherwise enable user interaction such as the providing of inputs to the system. In the context of a remote user interface, data transmission between for example the vehicle control system and the user interface may take the form of a wireless communications system and associated components as are conventionally known in the art.

The excavator 100A as the exemplary self-propelled work vehicle may including a mechanical coupling mechanism 110 as previously noted, wherein one or more hooks engage corresponding elements when the excavator approaches the desired attachment implement 120. The boom assembly 102A may be caused by the operator to be hydraulically raised, wherein the hooks are correspondingly raised to pull a lower portion of the rear of the attachment implement 120 to a guided position relative to the coupler 110. In some embodiments, a pin may be manually slid into place for securely coupling the lower portion of the attachment implement, or alternatively a hydraulic pin arrangement may be utilized for the same.

Referring to FIG. 2, the illustrated work vehicle 100 is a loader 100B and the relevant attachment implement 120 is a front-mounted loader bucket 120B. As with the excavator bucket 120A in FIG. 1, the loader bucket 120B faces generally away from the operator of the loader 100B, and is moveably coupled to the main frame 132 via a boom assembly 1021B for forward-scooping, carrying, and dumping dirt and other materials.

In other embodiments, depending for example on the type of self-propelled work vehicle 100, the attachment implement 120 may be a sweep cleaner, hay bale fork, hay bale hugger, grapple, scraper, pallet fork, debris blower, blade, snow pusher, or the like for performing a specific task.

A self-propelled work vehicle 100 as disclosed herein may typically include a controller 112, which may be part of the machine control system of the working machine, or it may be a separate control module. Accordingly, the controller 112 may generate control signals for controlling the operation of various actuators throughout the work vehicle 100, which may for example be hydraulic motors, hydraulic piston-cylinder units, electric actuators, or the like. Electronic control signals from the controller 112 may for example be received by electro-hydraulic control valves associated with respective actuators, wherein the electro-hydraulic control valves control the flow of hydraulic fluid to and from the respective hydraulic actuators to control the actuation thereof in response to the control signal from the controller 112. The controller 112 may include or be functionally linked to the user interface 116 and optionally be mounted in the operators cab at a control panel 114.

The controller 112 may be configured to receive input signals from some or all of various sensors associated with the work vehicle 100, which in the present disclosure at least include sensing modules 152 mounted on or otherwise located in association with the coupling mechanism 110. Certain other sensors may be provided to detect machine operating conditions or positioning, including for example an orientation sensor, global positioning system (GPS) sensors, vehicle speed sensors, vehicle attachment implement positioning sensors, and the like, and whereas one or more of these sensors may be discrete in nature the sensor system may further refer to signals provided from the machine control system.

A controller 112 in an embodiment may include or may be associated with a processor, a computer readable medium, a communication unit, data storage such as for example a database network, and the aforementioned user interface 116 or control panel 114 having a display. An input/output device, such as a keyboard, joystick or other user interface tool, may be provided so that the human operator may input instructions to the controller 112. It is understood that the controller described herein may be a single controller having all of the described functionality, or it may include multiple controllers wherein the described functionality is distributed among the multiple controllers.

Various operations, steps or algorithms as described herein can be embodied directly in hardware, in a computer program product such as a software module executed by a processor, or in a combination of the two. The computer program product can reside in RAM memory, flash memory, ROM memory, EPROM memory, EEPROM memory, registers, hard disk, a removable disk, or any other form of computer-readable medium known in the art. An exemplary computer-readable medium can be coupled to the processor such that the processor can read information from, and write information to, the memory/storage medium. In the alternative, the medium can be integral to the processor. The processor and the medium can reside in an application specific integrated circuit (ASIC). The ASIC can reside in a user terminal. In the alternative, the processor and the medium can reside as discrete components in a user terminal.

The term "processor" as used herein may refer to at least general-purpose or specific-purpose processing devices and/or logic as may be understood by one of skill in the art, including but not limited to a microprocessor, a microcontroller 112, a state machine, and the like. A processor can also be implemented as a combination of computing devices, e.g., a combination of a DSP and a microprocessor, a plurality of microprocessors, one or more microprocessors in conjunction with a DSP core, or any other such configuration.

A communication unit may support or provide communications between the controller 112 and external systems or devices, and/or support or provide a communication interface with respect to the sensing elements and other internal components of the work vehicle 100. The communications unit may include wireless communication system components (e.g., via cellular modem, WiFi. Bluetooth or the like) and/or may include one or more wired communications terminals such as universal serial bus ports.

Figure 3:
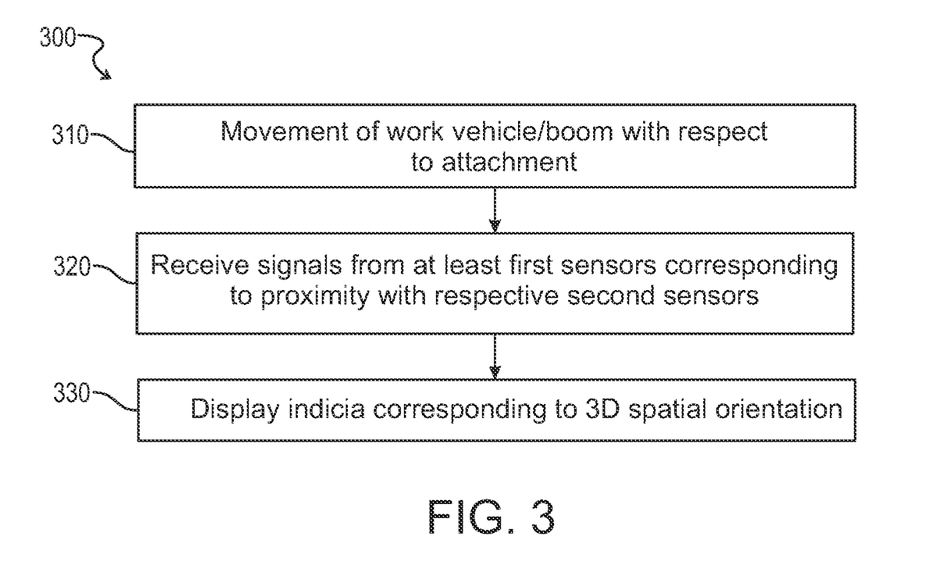
FIG. 3 is a flowchart representing an exemplary method as disclosed herein.

An exemplary embodiment of a method 300 for navigating an operator of the aforementioned self-propelled work vehicles may next be described, with illustrative reference to FIG. 3.

Figure 4A:
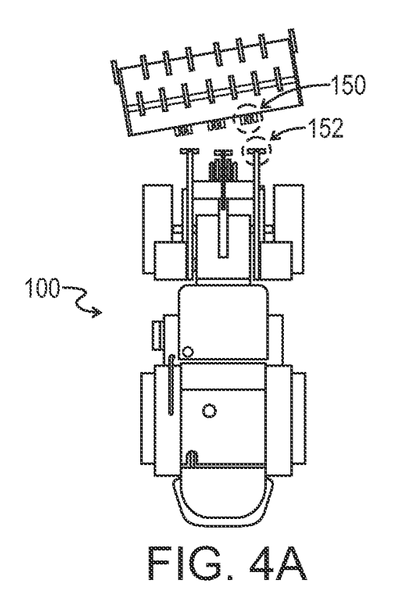
FIG. 4A is a top view of an exemplary work vehicle prior to attachment of an associated implement.
Figure 4B:
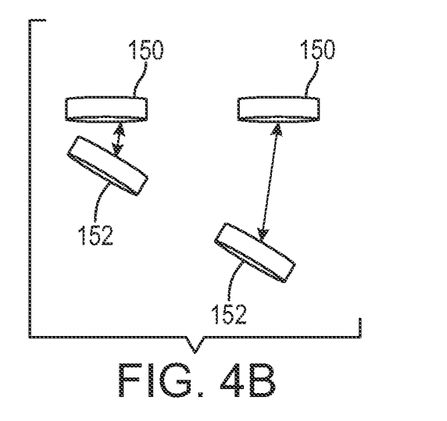
FIG. 4B is a top view of respective sensing elements associated with the work vehicle and the attachment implement of FIG. 4A.
Figure 4C:
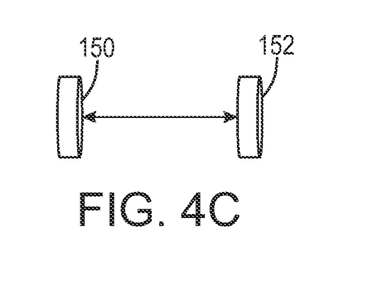
FIG. 4C is a side view of respective sensing elements associated with the work vehicle and the attachment implement of FIG. 4A.

The work vehicle 100 in an exemplary context is not yet attached to an attachment implement 120. In step 310, the operator of the work vehicle directs the work vehicle and/or boom assembly (where relevant) to a position wherein the coupling mechanism 110 is capable of aligning with and attaching to a desired attachment implement, for example having an appropriate configuration for an upcoming project. In FIG. 4A, a loader 100 is represented approaching an attachment implement 120 from an angle, as opposed to a desired parallel approach angle. The coupler 110 is provided with a first set of sensing elements 152, and the attachment implement 120 is provided with a second set of sensing elements 150, with the first and second sets of sensing elements having corresponding locations such that they are in a predetermined alignment with each other when the coupler 110 and the attachment implement 120 are properly aligned for mechanical coupling. As shown in an illustrative top view of the respective sensing elements in FIG. 4B, and an illustrative side view of the respective sensing elements in FIG. 4C, the relative positioning of the different pairs of first sensing elements 152 and corresponding second sensing elements 150 may indicate an alignment of the coupler 110 relative to the attachment implement 120.

Figure 5:
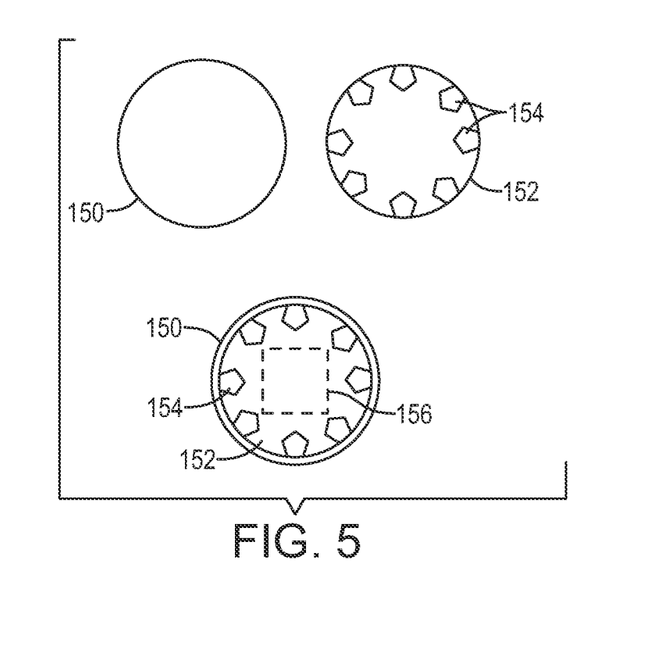
FIG. 5 is a modified illustration of a magnet and sensor module as exemplary first and second sensing elements as disclosed herein, represented alone and further in appropriate alignment with each other.

In an embodiment as represented in FIG. 5, the set of sensing elements 150 for the attachment implement 120 may include one or more magnets mounted or otherwise arranged in a predetermined configuration therewith. The set of sensing elements 152 for the work vehicle 100 may comprise one or more sensor modules 152 mounted or otherwise arranged in a corresponding predetermined configuration therewith, and at least in proximity to the coupler 110 on the boom assembly/work vehicle.

As further represented in FIG. 5, the sensor modules 152 may for example include a plurality of Hall-Effect sensors 154 disposed along a circumference of the respective module, which may itself for example be disc-shaped. One of skill in the art may appreciate that Hall-Effect sensors are but one exemplary implementation of a sensor for this purpose, and that various alternative sensors may be utilized, for example as capable of generating signals representative of a differential strength of the magnetic field based on proximity to the corresponding magnet 150 on an attachment implement 120. The sensor modules 152 may further include their own respective controllers 156, configured to combine all the data from sensors 154 residing thereon and to communicate the same to the machine controller 112 and/or user interface 116 over the appropriate communications (e.g., CAN/Lin) network.

Based on signals received from at least the first set of sensing elements 152, the system may (in step 320) accordingly estimate the position and the proximity information of the magnet (or other exemplary sensing element on the attachment implement 120) 150 with respect to the sensor modules (or other exemplary sensing element associated with the coupler 110) 152, e.g. by detecting the differential strength of the magnetic field by each sensor 154 on the sensor module 152. The raw position and proximity information from the sensors may then be translated into further information indicating how far the magnet is from sensor, along with horizontal and vertical offsets.

The method 300 continues in step 330, wherein indicia is displayed to the operator of the work vehicle 110 corresponding to a three-dimensional spatial orientation of the coupler 110 with respect to the attachment implement 120. As further described herein with respect to FIGS. 6A-6C and 7A-7B, the display unit 116 may in an embodiment have a display generated thereon with multiple portions 160 corresponding to each pair of sensing elements 150, 152, and with each portion 160 comprising a dynamic indicator 164 and a cross-hair 162 or the equivalent.

In one example, a display unit 116 is caused to display a first cross-hair 162A on a first portion 160A of the display unit and a second cross-hair 162B on a second portion 106B of the display unit. For each respective portion 160, the status of the dynamic indicator 164 and the cross-hair 162 may generally indicate the position of a portion of the attachment 120 with respect to its corresponding portion of the coupler 110 on the boom/vehicle, i.e. in terms of forward/backward (z-axis), top/bottom (y-axis) and left/right (x-axis) offsets. For example, the indicator 164 may be configured to dynamically change color to "green" if the attachment is in within a predetermined threshold proximity to the coupler 110 or "yellow" if the detected area from the attachment 120 is outside of the predetermined threshold proximity from the respective sensing element 150 associated with the coupler 110. The indicator 164 may further be configured to dynamically "float" inside the cross-hair 162, indicating the alignment/position of the detected area from the attachment 120 with reference to the appropriate sensing element 150 associated with the coupler 110. In such an embodiment, once the dynamic indicator 164 is centered to the cross-hair 162 and is indicated in "green," then the operator can safely engage the coupler 110 between the attachment 120 and the boom/vehicle.

The number of portions 160 and corresponding pairs of sensing elements 150, 152 on the display unit 116 for a given embodiment may vary, depending among other things on the type and complexity of the attachment 120 and/or coupler 110. For example, a typical loader may require two crosshairs 162 and associated dynamic indicators 164 to align the attachment 120 and the coupler 110 for a given boom/vehicle. The positioning and number of sensor modules utilized may further vary depending on the required accuracy and cost. For example, it may be contemplated that the number of Hall-Effect sensors in a particular embodiment of a sensor module can vary from two and in multiples of two, depending on the required accuracy, efficiency, cost, etc.

Figure 6A:
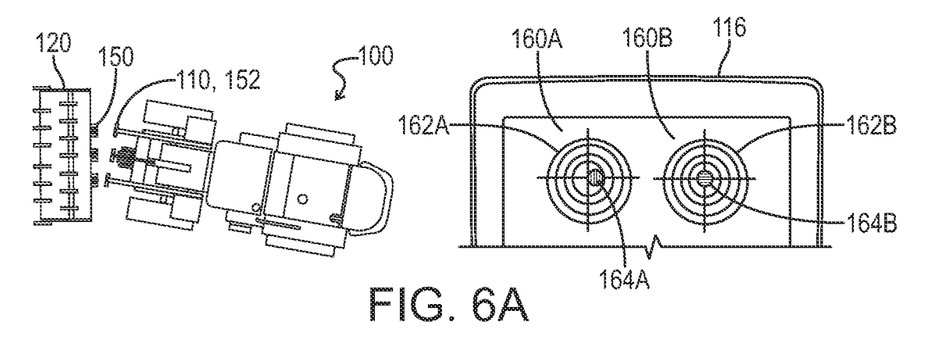
FIG. 6A is a top view of a loader as the work vehicle with a distance misalignment of first sensing elements with respect to second sensing elements for an associated attachment implement, and an exemplary view of a user interface and associated indicia representing the misalignment according to an embodiment as disclosed herein.
Figure 6B:
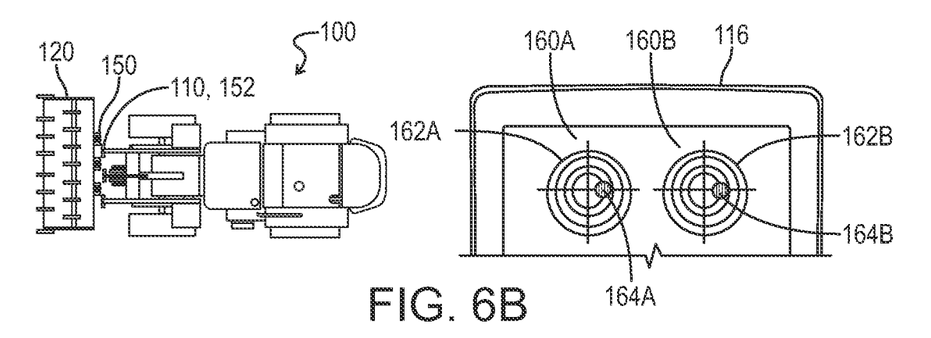
FIG. 6B is a top view of the loader of FIG. 6A with a left-to-right misalignment of the first sensing elements with respect to the second sensing elements, and an exemplary view of a user interface and associated indicia representing the misalignment according to an embodiment as disclosed herein.
Figure 6C:
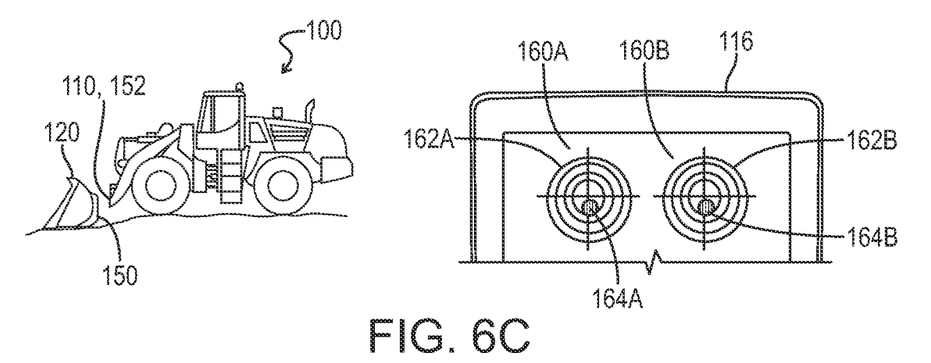
FIG. 6C is a side view of the loader of FIG. 6A with a top-to-bottom misalignment of the first sensing elements with respect to the second sensing elements, and an exemplary view of a user interface and associated indicia representing the misalignment according to an embodiment as disclosed herein.

Referring to FIGS. 6A, 6B, and 6C, three exemplary scenarios may be described with respect to a loader, which are illustrative in nature and in no way limiting on the scope of the present disclosure unless otherwise expressly stated.

FIG. 6A represents an example wherein a loader 100 and the desired attachment implement 120 are misaligned, with the respective coupler 110 portions being too close to the implement on the left side and too far apart from the implement on the right side, with the terms "left" and "right" referring herein with respect to a moving direction of the work vehicle towards the desired attachment implement. As represented in the first portion 160A and the second portion 160B of the display unit 116, both of the dynamic indicators 164A, 164B are centered in the respective cross-hairs 162A, 162B, but the first dynamic indicator 164A corresponding to the left side of the coupler 110 is generated with a first color (e.g., green) to indicate a close proximity and the second dynamic indicator 164B corresponding to the right side of the coupler 110 is generated with a second color (e.g., yellow) to indicate the coupler is farther away from the attachment implement on the right side.

FIG. 6B represents the same loader as in FIG. 6A, wherein the loader 100 is still misaligned with respect to the desired attachment implement 120, with the respective coupler portions being the same distance from the attachment implement on both sides but laterally misaligned to the right. As represented in the first portion 160A and the second portion 160B of the display unit 116, both of the dynamic indicators 164A, 164B are generated with the same color (e.g., green), but are also shown as floating to the right side of the cross-hairs 162A, 162B, respectively.

FIG. 6C also represents the same loader as in FIGS. 6A and 6B, wherein the loader 100 is still misaligned with respect to the desired attachment implement 120, with the respective coupler portions being the same distance from the attachment implement on both sides but misaligned to be above the desired positions with respect to the attachment implement. As represented in the first portion 160A and the second portion 160B of the display unit 116, both of the dynamic indicators 164A, 164B are generated with the same color (e.g., green), but are also shown as floating to the bottom of the cross-hairs 162A, 162B, respectively.

Figure 7A:
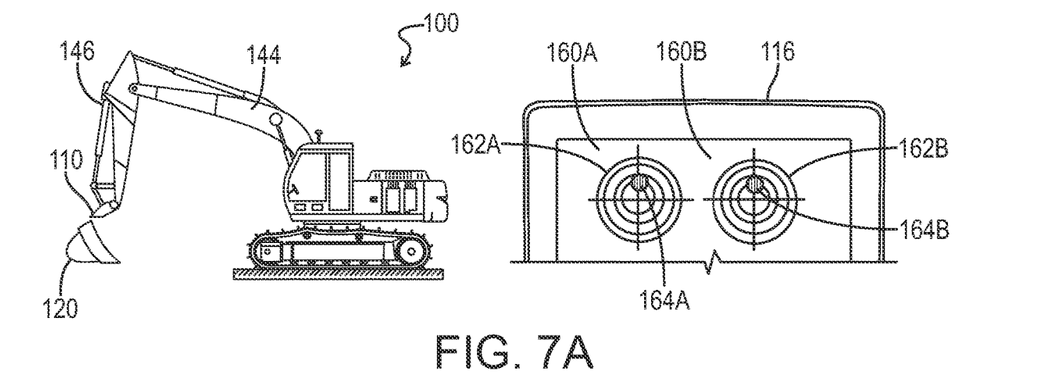
FIG. 7A is a side view of an excavator as the work vehicle with a front-to-back/left-to-right misalignment of first sensing elements with respect to second sensing elements for an associated attachment implement, and an exemplary view of a user interface and associated indicia representing the misalignment according to an embodiment as disclosed herein.
Figure 7B:
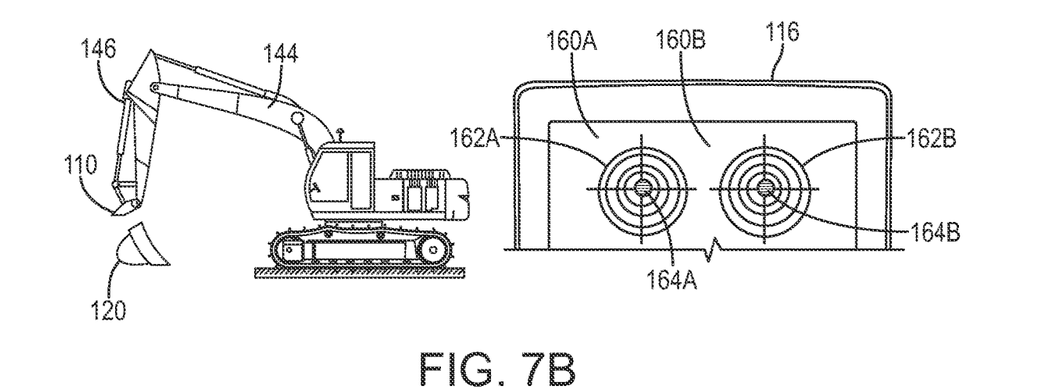
FIG. 7B is a side view of the excavator of FIG. 7A with a top-to-bottom misalignment of the first sensing elements with respect to the second sensing elements, and an exemplary view of a user interface and associated indicia representing the misalignment according to an embodiment as disclosed herein.

Referring to FIGS. 7A and 7B, two additional exemplary scenarios may be described with respect to an excavator, which are illustrative in nature and in no way limiting on the scope of the present disclosure unless otherwise expressly stated.

FIG. 7A represents an example wherein an excavator 100 and the desired attachment implement 120 are misaligned, with both respective coupler 110 portions on the boom assembly being close to the attachment implement but horizontally misaligned. As represented in the first portion 160A and the second portion 160B of the display unit 116, both of the dynamic indicators 164A, 164B are generated with the same color (e.g., green), but are also shown as floating to the top of the cross-hairs 162A, 162B, respectively.

FIG. 7B represents the same excavator as in FIG. 7A, wherein the boom of the excavator 100 is still misaligned with respect to the desired attachment implement 120, with the respective coupler portions being appropriate lined up horizontally (front-back and left-right) but vertically (top-bottom) too far away. As represented in the first portion 160A and the second portion 160B of the display unit 116, both of the dynamic indicators 164A, 164B are centered in the respective cross-hairs 162A, 162B, but are further generated with a color (e.g., yellow) to indicate the coupler is not within a threshold proximity of the attachment implement on either side.

As used herein, the phrase "one or more of," when used with a list of items, means that different combinations of one or more of the items may be used and only one of each item in the list may be needed. For example, "one or more of" item A, item B, and item C may include, for example, without limitation, item A or item A and item B. This example also may include item A, item B. and item C, or item B and item C.

Thus, it is seen that the apparatus and methods of the present disclosure readily achieve the ends and advantages mentioned as well as those inherent therein. While certain preferred embodiments of the disclosure have been illustrated and described for present purposes, numerous changes in the arrangement and construction of parts and steps may be made by those skilled in the art, which changes are encompassed within the scope and spirit of the present disclosure as defined by the appended claims. Each disclosed feature or embodiment may be combined with any of the other disclosed features or embodiments.

What is claimed is:

1. A system for navigating an operator of a self-propelled vehicle for coupling with an attachment implement therefor, the system comprising:
   a plurality of disc-shaped sensor modules mounted in a defined orientation with respect to a coupler which is moveable in association with the self-propelled vehicle, each of the disc-shaped sensor modules comprising a plurality of first sensing elements mounted about a circumference of the disc-shaped sensor modules;
   a plurality of second sensing elements comprising corresponding magnets arranged with respect to the attachment implement and in a corresponding defined orientation with respect to that of the coupler;
   each one of the plurality the disc-shaped sensor modules forming a sensing pair with a respective one of the plurality of second sensing elements;
   a user interface in functional communication with at least the plurality of first sensing elements and comprising a respective display portion for each of a plurality of the sensing pairs, wherein:
   each of the respective display portions comprises an indicator dynamically adjusted in position for first and second dimensions of alignment of the respective sensing pair, as determined from a differential strength of the magnetic field based on proximity of the plurality of first sensing elements to the corresponding magnets, and
   the indicator in each of the respective display portions is further dynamically adjusted in appearance corresponding to a third dimension of distance between the disc-shaped sensing module and the corresponding magnets.

2. The system of claim 1, wherein each of the plurality of the respective display portions comprises a crosshair representing the first and second dimensions of alignment.

3. The system of claim 1, wherein the indicator in each of the respective display portions is color-coded corresponding to the distance between the corresponding first and second sensing elements.

4. The system of claim 1, wherein each of the disc-shaped sensing modules comprise a controller configured to:
   receive signals corresponding to a respective magnetic field strength from each of the disc-shaped sensing modules;
   determine relative positions of each of the plurality of the disc-shaped sensing modules with respect to the corresponding magnets, and
   generate output signals to the user interface via a communications network, the output signals corresponding to the three-dimensional spatial orientation of the disc-shaped sensing modules with respect to the corresponding magnets.

5. The system of claim 1, wherein the self-propelled vehicle comprises a main frame and a boom having a distal end moveable with respect to the main frame, wherein the plurality of first sensing elements and the coupler are arranged at the distal end of the boom.

6. A self-propelled vehicle comprising:
   a main frame supported by one or more ground engaging units;
   a coupler moveable in association with the self-propelled vehicle;
   plurality of disc-shaped sensor modules mounted in a defined orientation with respect to the coupler, each of the disc-shaped sensor modules comprising a plurality of first sensing elements mounted about a circumference of the disc-shaped sensor modules;

one or more controllers configured to determine three-dimensional spatial orientations for each one of the plurality of disc-shaped sensor modules with respect to a corresponding second sensing element of a plurality of second sensing elements arranged with respect to an attachment implement, each of the second sensing elements comprising magnets; and a user interface in functional communication with the one or more controllers and comprising a respective display portion for each of the plurality of disc-shaped sensor modules, wherein:

each respective display portion comprises an indicator dynamically adjusted in position for first and second dimensions of alignment of each of the plurality of disc-shaped sensor modules and corresponding magnets, as determined from a differential strength of a magnetic field based on proximity of the plurality of first sensing elements to the corresponding magnets, and the indicator in each respective display portion is further dynamically adjusted in appearance corresponding to a third dimension of distance between the plurality of disc-shaped sensing modules and the corresponding magnets.

7. The self-propelled vehicle of claim 6, wherein each of a plurality of respective display portions comprises a crosshair representing the first and second dimensions of alignment.

8. The self-propelled vehicle of claim 6, wherein the indicator in each of the plurality of display portions is color-coded corresponding to the distance between the corresponding plurality of first and second sensing elements.

9. The self-propelled vehicle of claim 6, wherein the self-propelled vehicle comprises a boom having a distal end moveable with respect to the main frame, wherein the plurality of the first sensing elements and the coupler are arranged at the distal end of the boom.

10. The self-propelled vehicle of claim 6, wherein each of the plurality of disc-shaped sensor modules comprise a controller of the one or more controllers, the respective controllers for a given disc-shaped sensor module configured to:

receive signals corresponding to a respective magnetic field strength from each of the plurality of disc-shaped sensor modules, determine relative positions of each of the plurality of disc-shaped sensor modules with respect to the corresponding second sensing element, and generate output signals to the user interface via a communications network, the output signals corresponding to the three-dimensional spatial orientation of each of the plurality disc-shaped sensor modules with respect to the corresponding magnets.

11. A method of navigating an operator of a self-propelled vehicle for coupling with an attachment implement therefor, the method comprising:

generating signals from a plurality of disc-shaped sensor modules mounted in a defined orientation with respect to a coupler associated with the self-propelled vehicle, each of the plurality of disk-shaped sensor modules comprising a plurality of first sensing elements mounted about a circumference of the disc-shaped sensor module, and each one of the plurality of first sensing elements forming a sensing pair with a respective one of a plurality of second sensing elements comprising magnets arranged with respect to the attachment implement; and for each of plurality of display portions corresponding to each of the plurality of sensing pairs on a user interface in functional communication with at least the plurality of disk-shaped sensing modules, dynamically adjusting a position of an indicator for first and second dimensions of alignment of the respective sensing pair, as determined from a differential strength of a magnetic field based on proximity of the plurality of first sensing elements to the corresponding magnets; and further dynamically adjusting the indicator in appearance corresponding to a third dimension of distance between the plurality of disk-shaped sensing modules and the corresponding magnets.

12. The method of claim 11, wherein each of the plurality of display portions comprises a crosshair representing the first and second dimensions of alignment.

13. The method of claim 12, wherein the indicator in each portion is color-coded corresponding to the third dimension of distance between corresponding first and second sensing elements.

\* \* \* \* \*